(12) United States Patent
Chen et al.

(10) Patent No.: US 10,211,024 B1
(45) Date of Patent: Feb. 19, 2019

(54) SYSTEM AND METHOD FOR AXIAL SCANNING BASED ON STATIC PHASE MASKS

(71) Applicant: The Chinese University of Hong Kong, Hong Kong (CN)

(72) Inventors: Shih-Chi Chen, Hong Kong (CN); Yina Chang, Hong Kong (CN); Chenyang Wen, Hong Kong (CN); Chenglin Gu, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 1 day.

(21) Appl. No.: 15/665,731

(22) Filed: Aug. 1, 2017

(51) Int. Cl.
| | |
|---|---|
| *G02B 21/00* | (2006.01) |
| *H01J 37/147* | (2006.01) |
| *G03F 1/42* | (2012.01) |
| *G02B 26/08* | (2006.01) |
| *G02B 26/00* | (2006.01) |
| *H01J 37/28* | (2006.01) |

(52) U.S. Cl.
CPC ...... *H01J 37/1474* (2013.01); *G02B 21/0032* (2013.01); *G02B 21/0056* (2013.01); *G02B 26/001* (2013.01); *G02B 26/0808* (2013.01); *G03F 1/42* (2013.01); *H01J 37/28* (2013.01)

(58) Field of Classification Search
CPC ... G02B 7/28; G02B 7/36; G02B 7/38; G02B 21/00; G02B 21/0004; G02B 21/002; G02B 21/0024; G02B 21/0032; G02B 21/0036; G02B 21/0048; G02B 21/0052; G02B 21/006; G02B 21/0076; G02B 21/06; G02B 21/082; G02B 21/24; G02B 21/241; G02B 21/244; G02B 21/36; G02B 21/361; G02B 27/0025; G02B 27/0068; G02B 27/0075
USPC ............... 359/362, 363, 368, 385, 388, 433
See application file for complete search history.

(56) References Cited

U.S. PATENT DOCUMENTS

| | | | |
|---|---|---|---|
| 8,379,321 B2* | 2/2013 | Szapiel | G02B 13/146 359/707 |
| 2010/0214404 A1* | 8/2010 | Chen | G02B 21/0032 348/79 |

* cited by examiner

*Primary Examiner* — Arnel C Lavarias
(74) *Attorney, Agent, or Firm* — Schwegman Lundberg & Woessner, P.A.

(57) ABSTRACT

Methods and systems for axial-scanning a sample. The method may include generating a scanning beam along a transverse scanning direction across the sample; acquiring radial positions of the generated scanning beam along the transverse scanning direction; and determining, based on the radial positions of the generated scanning beam and desired focal lengths, a phase mask so that the scanning beam at different radial positions along the scanning direction is focused to different axial positions of the sample along an optical axis transverse to the scanning direction.

17 Claims, 5 Drawing Sheets

SYSTEM AND METHOD FOR AXIAL SCANNING BASED ON STATIC PHASE MASKS

TECHNICAL FIELD

The present disclosures relate to the field of laser applications, and more specifically, to a system and a method for axial scanning with a phase mask.

BACKGROUND OF THE APPLICATION

In the prior art, the axial scanning methods include a mechanical scanning method, a remote focusing control method, a depth-of-field extension method, etc. In the mechanical scanning method, mechanical scanners are used to perform laser axial scanning. i.e., to move the objective lens or the specimen. However, the speed of mechanical scanning process is limited by the objective lens' inertia. For example, the speed of mechanically scanning the objective lens of a microscope using a piezoelectric actuator is limited to 10s Hz due to the weight of the objective lens.

In the remote focusing control method via electrical tunable lens (ETL) or spatial light modulators (SLM), the focal length of ETL can be electrically tuned by applying different current, and the spatial light modulators can be encoded with a standard lens' phase pattern to control the focus. However, the pattern update rate of an SLM is on the scale of 100 Hz, resulting in low speed. In the depth-of-field extension method, a wavefront encoder element or system may be used, or there exists an increase of spherical aberration with external medium, wherein a lens with extended focal length may be used by controlling spherical aberration. However, this could only be implemented in an imaging system as the real focal position is not controlled precisely and time-consuming post processing steps may be needed when the scanning range is large, i.e., deconvolution, to obtain high quality images.

The axial scanning methods in the prior art are either too slow (limited by the inertia of the objective lens or specimen) or have limited speeds, e.g., an electrical tunable lens (ETL) can scan only up to 100s Hz.

There is therefore a need for a practical approach to address at least one of the abovementioned problems.

SUMMARY

The system and method for axial-scanning a sample provided in the present application can perform ultra-high-speed axial scanning along the optical axis by scanning transversely across a static phase mask and achieve a scanning speed of ~10s kHz. The system and method for axial scanning of the present application can be easily implemented in any laser scanning systems and generate great impact in both industrial and academic applications. Comparing with the traditional axial scanning solutions, the system and method of the present application has the following advantages: (1) high speed: up to 10s kHz; (2) low cost: no active components are required; and (3) simple & compact: no synchronization and post processing of image are required.

The method and system for high-speed axial scanning according to the present application may be widely useful in various imaging and laser applications, e.g., confocal or two-photon laser scanning microscopy laser manufacturing, real-time volume imaging, e.g., light sheet microscopy or ultrafast 3D prototyping by two photon polymerization.

According to an aspect of the present disclosure, a method for axial-scanning a sample may comprise generating a scanning beam along a transverse scanning direction across the sample; acquiring radial positions of the generated scanning beam along the transverse scanning direction; and determining, based on the radial positions of the generated scanning beam and desired focal lengths, a phase mask so that the scanning beam at different radial positions along the scanning direction is focused to different axial positions of the sample along an optical axis transverse to the scanning direction.

According to another aspect of the present disclosure, a system for axial scanning a sample may comprise: a scanning beam generator, generating a scanning beam along a transverse scanning direction through the sample; a detector, acquiring radial positions of the generated scanning beam along the transverse scanning direction; and a phase mask determined, based on the radial positions of the generated scanning beam and desired focal lengths, so that the scanning beam at different radial positions is focused to different axial positions of the sample along an optical axis transverse to the scanning direction.

According to another aspect of the present disclosure, a light sheet microscopy for imaging a sample may comprise: a detection objective lens, collecting emission signals from the sample; a galvanometric scanner, rotatable to guide the emission signals from the detection objective lens; a phase mask, receiving the emission signals guided at different radial regions on the phase mask from the scanner and adjusting focal lengths of the received emission signals, wherein the phase mask is designed based on positions of the emission signals and desired focal lengths; and an imaging device, capturing images of the sample based on the adjusted focal lengths, wherein the designed phase mask is controlled to adjust the focal lengths such that focal planes of the emission signals are coincident with the imaging device.

BRIEF DESCRIPTION OF THE DRAWING

Other features, objects and advantages of the present application will become more apparent from a reading of the detailed description of the non-limiting embodiments, said description being given in relation to the accompanying drawings, among which.

DETAILED DESCRIPTION

The present application will be further described in detail in conjunction with the accompanying drawings and embodiments. It should be understood that the specific embodiments described herein are provided to illustrate the present disclosures, instead of limiting the present disclosures. It also should be noted that only parts related to the present disclosures are shown in the figures for convenience of description.

It should be noted that, the embodiments of the present application and the features in the present application, on a non-conflict basis, may be combined with each other. The present application will be further described in detail below in conjunction with the accompanying drawings and embodiments.

Disclosed herein are systems and methods for axial-scanning a sample. According to the present application, a compact, fast and arbitrary axial scanning capability can be provided and a scanning speed of ~10s kHz can be achieved. The method and system of the present application can be adopted in both industry and scientific research.

Figure 1:
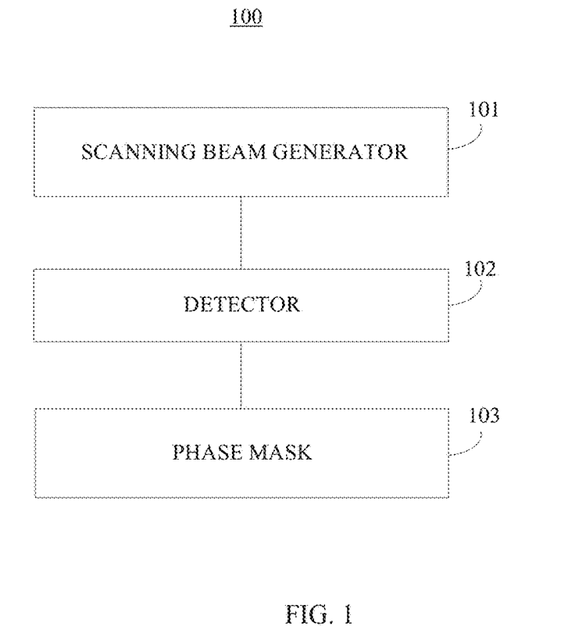
FIG. 1 illustrates a schematic block diagram of a system for axial scanning according to an embodiment of the present application.

FIG. 1 illustrates a block diagram of the system 100 for axial scanning according to an embodiment of the present application. The disclosed and described system hereinafter is exemplary and those skilled in the art will understand and appreciate that the system according to the present application is not limited to this.

As shown in FIG. 1, the system for axial scanning according to an embodiment may comprise a scanning beam generator 101, a detector 102 and a phase mask 103. The scanning beam generator 101 may generate a scanning beam along a transverse scanning direction across the sample. The detector 102 may acquire the radial positions of the generated scanning beam along the transverse scanning direction. The phase mask 103 may be determined (or designed) based on the radial positions of the generated scanning beam and desired focal lengths, a phase mask so that the scanning beam at different radial positions along the scanning direction is focused to different axial positions of the sample along an optical axis transverse to the scanning direction.

The scanning beam generator 101 may be a common device in laser systems and have a wide range of choices, e.g., a polygonal mirror scanner, a galvanometric scanner, a resonant scanner, an acoustic-opto deflector, or a spatial light modulator, etc. and can easily scan at high-speed. The scanning beam may be scanned across the phase mask by moving the beam transversely via the generator or rotating the generator.

The phase mask 103 may be a custom-made lens, which is efficient and inexpensive. In an embodiment, the phase mask may be a spatial light modulator. The phase mask may be fabricated separately or be incorporated into a spatial light modulator, such as a liquid crystal-based spatial light modulator (LC-SLM). The phase mask and the sample are static during the process of the axial scanning.

In an embodiment, the profile or pattern of the phase mask 103 may be determined to have desired optical characteristics. e.g., power, aberration correction properties, and efficiency.

Figure 2:
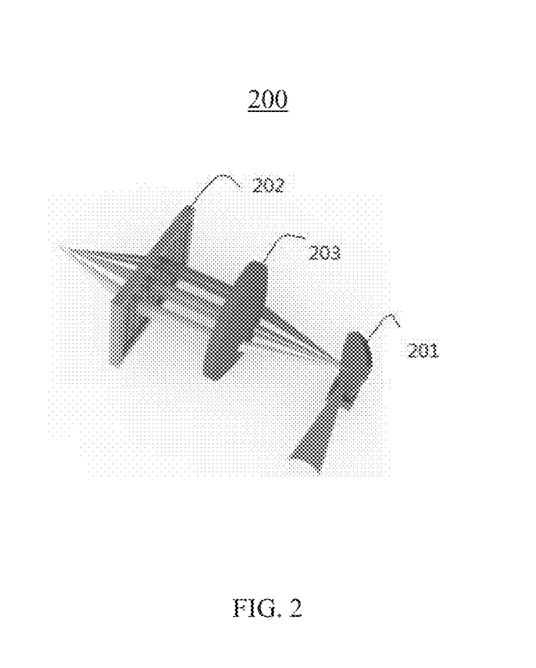
FIG. 2 illustrates an exemplary perspective diagram of a system for axial scanning according to an embodiment of the present application.

FIG. 2 illustrates an exemplary perspective diagram of a system for axial scanning according to an embodiment of the present application. The system 200 may include a scanning beam generator, such as a galvanometric scanner 201, a collimation lens 203 and a phase mask 202. In this embodiment, the collimation lens 203 may be positioned after the galvanometric scanner 201 and is used for guiding the laser beam to different radial positions on the phase mask 202.

Figure 3:
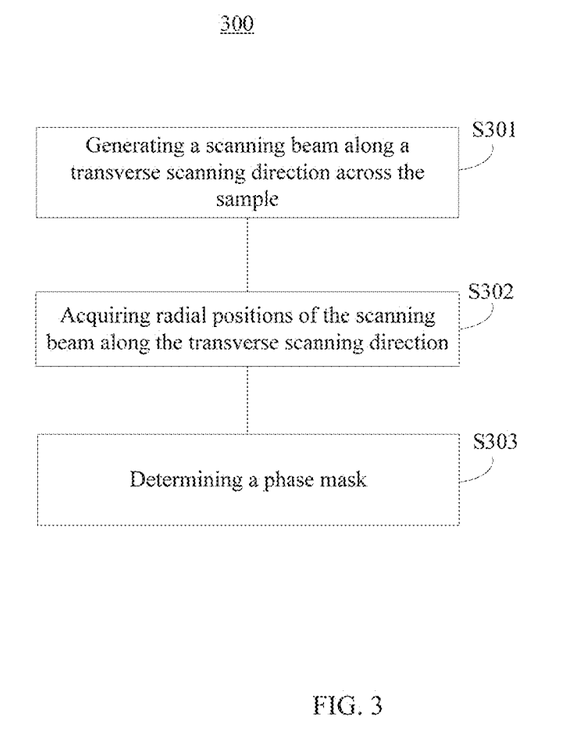
FIG. 3 illustrates a flowchart of a method for axial scanning according to an embodiment of the present application.

FIG. 3 illustrates a flowchart of a method for axial scanning according to an embodiment of the present application. At step S301, a scanning beam along a transverse scanning direction may be generated across the sample. At step S302, the radial positions of the generated scanning beam along the transverse scanning direction may be acquired. Hereinafter, the positions of the scanning beam along the transverse scanning direction may be referred to as the radial positions. The positions of the scanning beam along an optical axis which is transverse to the scanning direction may be referred to as the axial positions.

At step S303, a phase mask is determined (designed) based on the radial positions of the generated scanning beam and desired focal lengths, a phase mask so that the scanning beam at different radial positions along the scanning direction is focused to different axial positions of the sample along an optical axis transverse to the scanning direction. Therefore, the depth compensation is achieved, i.e., the illuminated plane is focused to the plane of a detector, such as a photodetector. According to an embodiment, depth information of the sample may be acquired according to the focused axial positions.

In an embodiment, the phase mask may be designed by obtaining the radial positions of the scanning beam by moving the scanning beam transversely across the phase mask; and determining a profile of the phase mask according to an incidence angle and a refraction angle of the scanning beam to the phase mask. In another embodiment, the relationships between the focal lengths and the radial positions may be examined for determining the profile of the phase mask.

Figure 4:
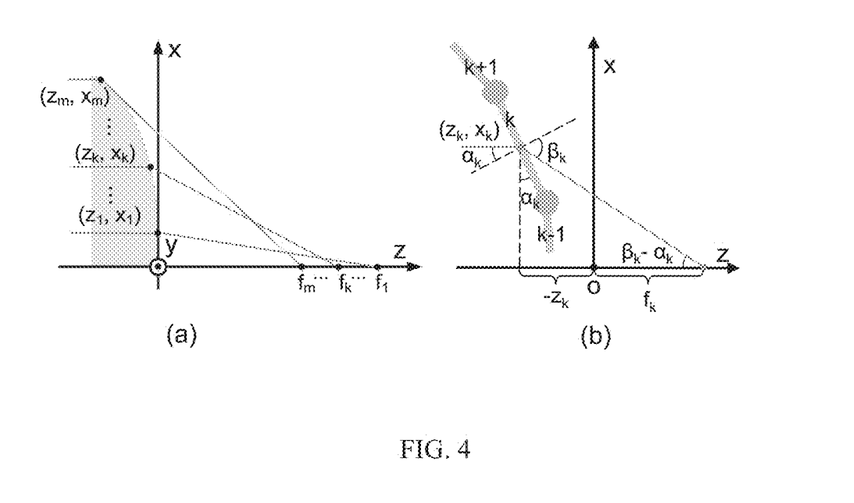
FIGS. 4(a) and 4(b) illustrate, respectively, spherical aberration induced axial focal shifts and tangent slope calculation of the method according to an embodiment of the present application.

Hereinafter, the method of designing the phase mask will be described in detail with reference to FIGS. 4(a) and 4(b). As illustrated in FIGS. 4(a) and 4(b), a focal points distribution along the optical axis are designated as $f_1, f_2 \ldots f_m$. The directions along and transverse to the scanning direction of the scanning beam are defined as the x direction and y direction, respectively. The focal length of the phase mask in the y direction is designated as $f_k$. The focal points along the optical axis (i.e., $f_1, f_2 \ldots f_m$) are a function of the radial positions of the incident scanning beam ($x_1, x_2 \ldots x_m$), i.e., $f_k = q(x_k)$.

In an embodiment, the phase mask is divided into m regions. For a local lens region at ($x_k, z_k$), an incident beam will be refracted and bent towards $f_k$; and the angles of incidence and refraction are designated as $\alpha_k$ and $\beta_k$, respectively. For each region, the slope may be solved simultaneously with the angle of incidence and refraction, as illustrated in FIG. 4(b). Accordingly, the profile of the phase mask in the x direction may be a continuous piecewise linear function.

Table 1 shows a pseudocode for obtaining the profile of the phase mask.

TABLE 1

1: For k = 1:1:m

2: $\begin{cases} n_1 \sin\alpha_k = n_2 \sin\beta_k \\ \tan(\beta_k - \alpha_k) = \dfrac{x_k}{-z_k + q(x_k)} \end{cases}$ //From Step 2, $\alpha_k$ and $\beta_k$ are obtained.
//$n_1$ and $n_2$: refractive indexes of the lens and air.
3: $z_{k+1} = z_k - (x_{k+1} - x_k) \cdot \tan\alpha_k$.
4: End
5: The radial lens profile $z = p(x)$ is obtained.

In an embodiment, the profile may be converted to equivalent 2D phase mask to be programmed to a lens or a spatial light modulator (SLM) using Fourier optics principle. When m is large, the function approaches the ideal profile. In an embodiment, m may be selected to match the resolution of the SLM, e.g., 3 to 5 divisions per SLM pixel.

Figure 5:
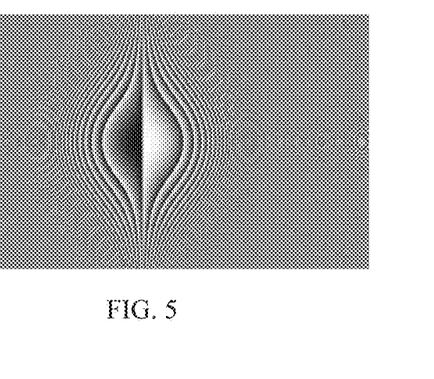
FIG. 5 illustrates an exemplary phase pattern of a 2D phase mask according to an embodiment of the present application.

An exemplary phase pattern of a 2D phase mask according to an embodiment of the present application is illustrated in FIG. 5. The pattern shown in FIG. 5 demonstrates that the focal length varies from −250 mm, −∞, +∞, to 250 mm as the light scans from the left end to the right end.

Hereinafter, an exemplary application of the method for axial scanning will be described with reference to FIG. 6, in which the method for axial scanning according to the present application is implemented to the light sheet microscope (LSM) to automatically follow the scanning in focal volume and enable high speed volumetric imaging that only limited by an imaging device, such as a CCD camera. The LSM based on the static phase mask eliminates the need of coupling the detection plane, thereby enabling high-speed volumetric imaging that is only limited by the speed of cameras e.g., ~1000 cross-sections/second.

Figure 6:
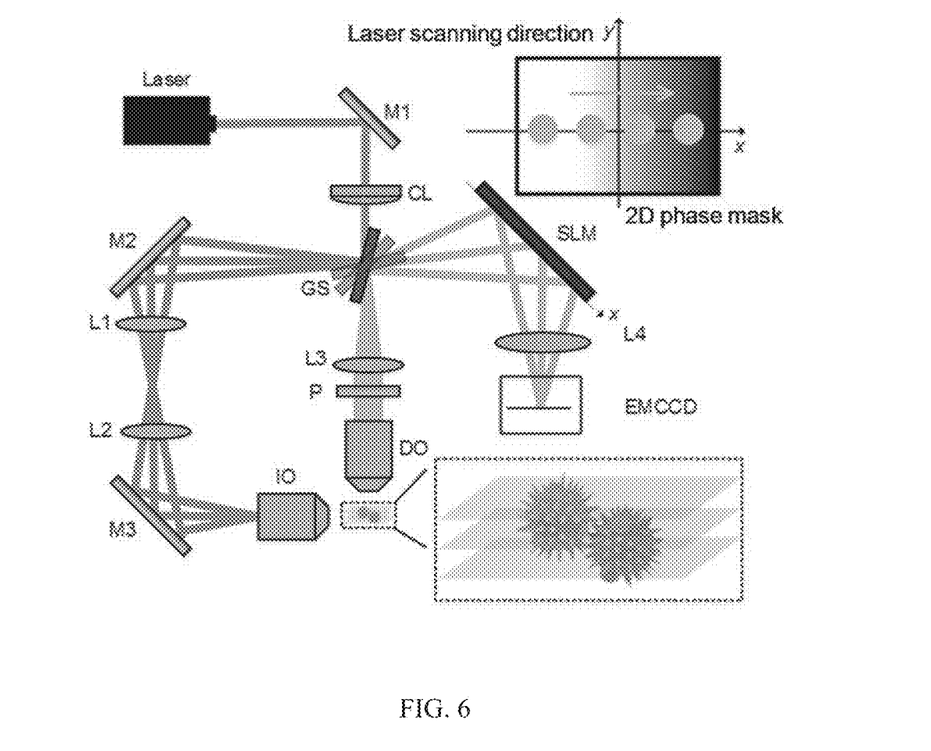
FIG. 6 illustrates an optical configuration of a Light sheet microscope (LSM) with a 2D phase mask according to an embodiment of the present application.

As shown in FIG. 6, in the illumination optics, a single/multiphoton excitation beam is generated from a laser source, which may be a continuous laser or a pulsed laser. The laser beam is refracted by a mirror M1 and focused by a cylindrical lens CL to form a light sheet. Next, the light sheet is focused onto a galvanometric scanner GS to change the depth location. After that, a 4-f system including a mirror M2, lens L1 and L2 and a mirror M3 adjusts the beam size to fill the back aperture of the illumination objective IO as well as to control the light sheet thickness. Note that GS is conjugated with the IO back aperture. Lastly, a thin light sheet, i.e., illumination plane, is generated in the focal volume and scanned axially for volumetric imaging. So far, the depth of illumination plane varies and defocuses with respect to detection optics. However, without compensation, the axial shift increases linearly with the square of the objective lenses' magnification factor. For example, when a 40× detection objective DO is used, a 10 micron axial scan can result in a 16 mm defocus on the CCD camera, which severely deteriorates the image quality.

The method of the present application is implemented in the detection optics. The emission signals are first collected by the detection objective DO (Nikon APO LWD 40×/1.15, Water immersed), which is paired with a lens L3 ($f_{L3}$=200 mm) to control the beam size. Next, the emission signals are guided to the back of the galvanometric scanner (GS), which routes the emissions from different depths to different lateral regions on a spatial light modulator (SLM) (such as a liquid crystal-based SLM), which serves as the phase mask which is designed to fine-adjust the focal lengths of the emission signals at different regions on the SLM.

The SLM functions as the phase mask with the designed pattern, so that the focal planes are always coincident with the CCD camera after the tube lens L4. In other words, the phase mask converts the radial scanning beam from the GS to the axial scanning, compensating the focal shifts in the detection optics. It is worthwhile to note that the SLM is used in the system to quickly evaluate the different phase mask designs; and during volume scanning processes, the phase patterns on the SLM remain unchanged. A polarizer may be included in the light path, in front of the SLM, which is sensitive to polarization.

An exemplary parametric model is used for the design and implementation processes. In an embodiment, when the method of the present application is implemented in the LSM optical system, the required axial scanning distance $\Delta z$ is related to the GS scanning angle $\theta$ as Eq. (1), $$\Delta z = f_{IO} \cdot \frac{f_{L1}}{f_{L2}} \cdot \tan(2\theta) \qquad (1)$$

where $\theta$ is proportional to the driving voltage, and the factor of 2 converts the mechanical angle to optical angle. To eliminate the defocusing effect, the focal length of the DO must be compensated for $-\Delta z$ at any scan angle $\theta$. This can be achieved by combining the DO with the phase mask, i.e., phase patterns on the SLM. Here, the phase mask functions as a special lens with different focal lengths $f_{SLM}$ at different radial positions, as expressed in Eq. (2).

$$f_{SLM} = -\frac{f_{DO}^2 d_1^2}{f_3^2 \Delta z} - d_1 \qquad (2)$$

where $d_1$ is the distance between the GS and the phase mask. Equation (2) is derived by considering the detection optics as a lens combination imaged at detection plane of the EMCCD. From Eq. (2), the required focal length $f_{SLM}$, i.e., $f_k$ for the point $(x_k, z_k)$ may be obtained. The profile $z=p(x)$ of the SLM incorporated the phase mask may be determined by using the method of designing the phase mask described as above.

Lastly, the profile is converted to an equivalent 2D phase map to be programmed to the SLM. The phase $\varphi_{xy,x}$ along the x direction, i.e., the scanning direction, can be obtained from Eq. (3), where $k=2\pi/\lambda$ is the wave number.

$$\varphi_{xy,x} = k \cdot (n_2 - n_1) \cdot p(x) \qquad (3)$$

The phase along the y direction, i.e., direction transverse to the scanning direction, can be obtained from Eq. (4), which is the phase of a spherical lens under paraxial condition, $$\varphi_{xy,y} = \frac{ky^2}{2q(x)} \qquad (4)$$

Accordingly, the total phase added to SLM is obtained as Eq. (5).

$$\varphi_{xy} = \varphi_{xy,x} + \varphi_{xy,y} \qquad (5)$$

Figure 7:
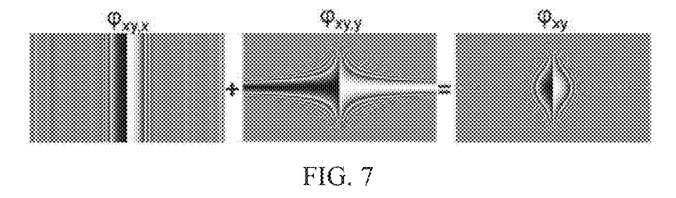
FIG. 7 illustrates the phase patterns programmed to a liquid crystal-based spatial light modulator (LC-SLM) according to an embodiment of the present application.

To apply Eq. (5) to the SLM, the modulus of the phase is converted to a [0-255] grayscale digital image. FIG. 7 illustrates the phase patterns shown in FIG. 5 programmed to a liquid crystal-based spatial light modulator (LC-SLM) according to an embodiment of the present application.

Like many other wavefront modulation-based axial scanning methods, the system magnification slightly varies as the focal shifts axially. The relationship between the magnification (M) and axial scanning distance (Δz) is mathematically described in Eq. (6).

$$M = \frac{f_4}{d_1 + d_2 - f_4} \cdot \frac{d_1 f_{DO} f_3}{d_1 f_{DO}^2 + f_3^2 \Delta z} \qquad (6)$$

where $d_2$ is the distance between the phase mask and L4. Note that $d_1$ and $d_2$ together can be used to fine-adjust the system magnification and the scan range.

In the conventional LSM, the excitation is focused by a cylindrical lens into a thin light sheet and directly illuminates a cross-section of the sample; the emissions are collected by a separate detection objective positioned orthogonally to the excitation laser. To achieve higher plane illumination speeds without disturbing the samples, a galvanometric scanner is integrated in LSMs to scan the light sheet axially. In order to obtain clear images throughout the scanning process, the detection plane must be synchronized and scanned simultaneously with the light sheet; the separation of the excitation and detection planes will result in blurry and defocused images on camera.

According to the present application, the detection plane can be automatically synchronized via the phase mask, enabling high-speed 3D imaging that is only limited by the speed of camera.

Figure 8:
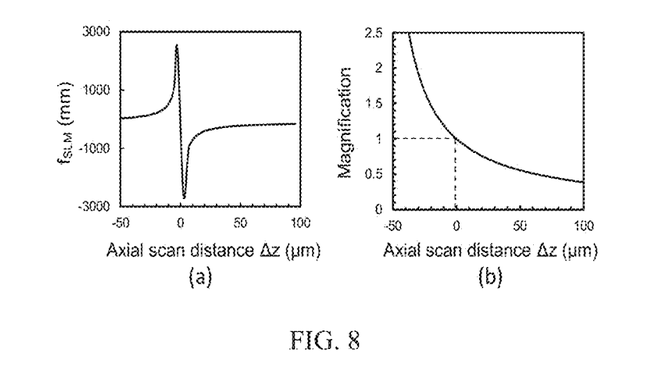
FIGS. 8(a) and 8(b) illustrate, respectively, the relationship between the focal length and the axial scan distance of the LC-SLM and the relationship between the magnification and the axial scan distance according to an embodiment of the present application.

The relationship between the focal length $f_{SLM}$ and the axial scan distance Δz of the SLM system (such as a LC-SLM) is illustrated in FIG. 8(a). Note that the LC-SLM adds no optical power when $f_{SLM}=\infty$, i.e., white screen on LC-SLM. The relationship between the magnification M and the axial scan distance Δz according to the embodiment is illustrated in FIG. 8(b). In the embodiment, the target scan range (Δz) is 100 μm, and thus a better range for axial scanning lies between −20 μm to 80 μm, where M=1.47 and 0.44 respectively. Note that the scanning performance, i.e., range and resolution, may be further increased if the LC-SLM has a larger aperture and smaller pixel sizes.

The volumetric imaging results of a stained pollen sample (~35 μm, mixed pollen grains, Carolina Biological Supply, USA) are illustrated in FIGS. 9(a) and 9(b) to test the capability of the method of the present application used in a LSM system. FIG. 9(a) illustrates images of pollens at different depths from the LSM with 2D phase mask and FIG. 9(b) illustrates the images of the pollens at different depths from the LSM with a piezoelectric objective scanner (PI-FOC, Physik Instruments).

Figure 9:
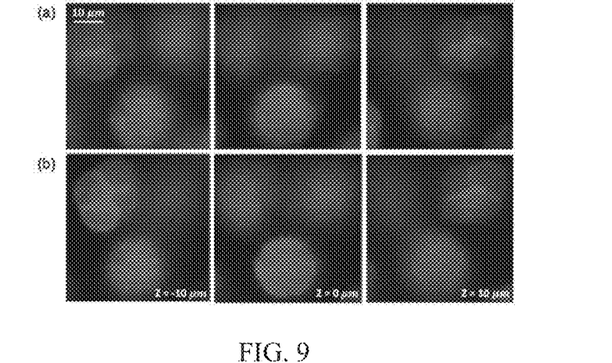
FIGS. 9(a) and 9(b) illustrates images of pollens at different depths from the LSM system with a 2D phase mask and the LSM with a piezoelectric objective scanner, respectively.

From FIGS. 9(a) and 9(b), images of three selected depths, i.e., −10 μm, 0 μm, and 10 μm, are presented, where the images of the same depths are grouped in the same column, showing indistinguishable quality and resolution throughout the scanning range. From the results, we can conclude that the phase mask can effectively perform high-speed axial scanning with comparable resolution versus mechanical scanning. In FIG. 9, we can also observe the field magnification effect; for example, the left and right columns are slightly demagnified and magnified respectively, matching well with the predicted field magnification in FIG. 8(b). Note that in all experiments the phase patterns on the LC-SLM remains unchanged, and the volumetric imaging speed is only limited by the GS or camera, e.g., 1000 frames per second for a typical EMCCD camera. The full characterization of the point spread function (PSF) of the LSM system as well as the tissue imaging results of mouse kidney samples are illustrated in FIGS. 10 and 11.

Figure 10:
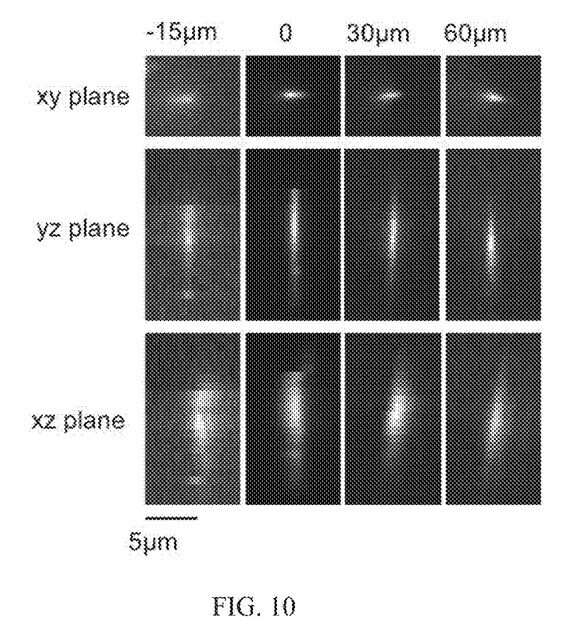
FIG. 10 illustrates the measured results of the point spread function (PSF) in each axis at four different depths of the LSM system according to an embodiment of the present application.

As illustrated in FIG. 10, the PSF of the LSM system is characterized via 1 μm diameter fluorescent bead samples (F8819, Thermo Fisher Scientific). The detection objective (DO) lens has a numerical aperture of 0.6 and magnification of 40×. The PSF in each axis is measured at four different depths, i.e., −15, 0, 30, and 60 μm, where the 0 position refers to the inherent focal plane of the DO. From FIG. 10, we may observe that the resolution of the LSM system in the x-/y-/z-direction is 1.6/1.0/8.0 μm in the inherent focal plane (z=0). As expected, the lateral resolution slightly worsens as it scans away from the original focal plane. Accordingly, the resolution at z=−15, 30, and 60 μm in the x-/y-/z-direction becomes 2.4/1.4/8.0 μm; 1.8/1.0/6.0 μm; and 1.8/1.0/6.0 μm, respectively. Importantly, the measured resolutions are comparable with most remote scanning methods used in LSM systems, e.g., electrical tunable lens. It is worthwhile to note that the lateral resolution in the x- and y-directions is different, where the resolution in the x-direction is slightly compromised due to the aberration introduced by the galvanometric scanning process.

Figure 11:
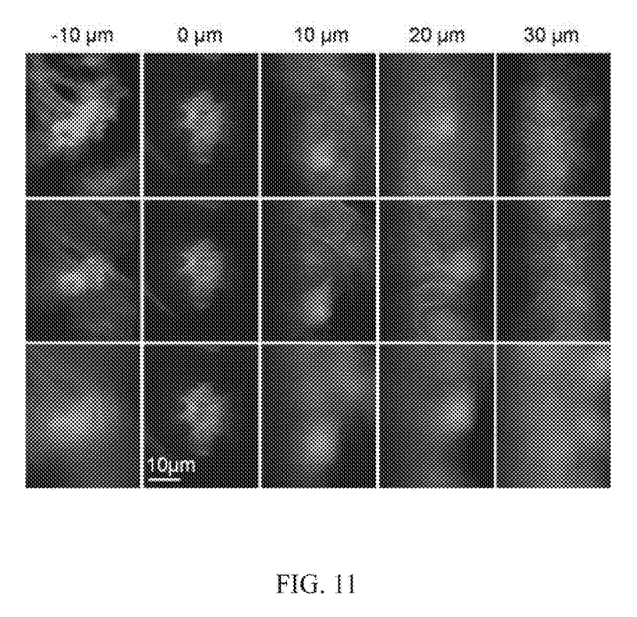
FIG. 11 illustrates the volume imaging results of mouse kidney samples at five different depths of the LSM system according to an embodiment of the present application.

FIG. 11 illustrates volume imaging results of the mouse kidney samples (F24630, Invitrogen, USA) at five different depths, i.e., −10, 0, 10, 20, 30 μm from the LSM system according to an implementation. In the implementation, a slice of fluorescently labeled glomeruli and convoluted tubules, i.e., mouse kidney, are used as the specimens. As the kidney slide is relatively thin (~20 μm), the specimen is placed in an oblique angle in reference to the excitation beam to generate sufficient depths for the volume imaging purpose. In FIG. 11, the top row presents the cross-sectional imaging results from the 2D phase mask according to the present application; the middle row presents the results of a piezoelectric scanner as a reference; and the bottom row presents the results obtained when the SLM is turned off, where the defocusing effect can be clearly observed. From the results, we can conclude that the 2D phase mask can effectively compensate the defocusing effect during axial scanning processes. The results in the top and middle rows are images obtained from the 2-D phase mask and piezoelectric scanner respectively. The bottom row shows images when the SLM is turned off, where the defocusing effect can be clearly observed.

An example in which the method for axial scanning of the present application is used in the SLM has been described above. It will be appreciated that the method and system for axial scanning of the present application is not limited to be used in the SLM. The application scenarios may include, not limited to, the following examples.

(1) Enabling high-speed volumetric imaging, e.g., light sheet microscopy. This would be interesting to companies working on light sheet microscopy including Carl Zeiss Microscopy and Leica Microsystem. The capability to visualize a volume instead of a cross-section is vital to study and understand biological events occurring at different depths simultaneously and interactively. Plane illumination techniques have become a mile stone in volumetric imaging. Our methods can enable high speed axial scanning in plane illumination technique, for example, to follow the excitation plane motion in light sheet microscopy to maintain a stationary image plane without complex synchronization or extra scanning components.

(2) Enable point-scanning imaging or fabrication on arbitrary plane. In a lot of imaging applications, by integrating our axial scanning unit, the position of the focal point can be assigned in a 3D volume. So one can follow and image specific biological structures, like the blood vessel or neurons and eliminate redundant portions. The new method can also be used in direct laser subtraction fabrication or two-photon polymerization process.

(3) Other scenarios require high-speed axial scanning, for example, laser scanning microscopy or 3D laser fabrication.

The flow charts and the block diagrams in the figures illustrate the system architectures, functions, and operations which may be achieved by the systems, devices, methods, and computer program products according to various embodiments of the present application. For this, each block of the flow charts or the block diagrams may represent a module, a program segment, or a portion of the codes which comprise one or more executable instructions for implementing the specified logical functions. It should also be noted that, in some alternative implementations, the functions denoted in the blocks may occur in a different sequence from that marked in the figures. For example, two blocks denoted in succession may be performed substantially in parallel, or in an opposite sequence, which depends on the related functions. It should also be noted that each block of the block diagrams and/or the flow charts and the combination thereof may be achieved by a specific system which is based on the hardware and performs the specified functions or operations, or by the combination of the specific hardware and the computer instructions.

The units or modules involved in the embodiments of the present application may be implemented in hardware or software. The described units or modules may also be provided in a processor. The names of these units or modules do not limit the units or modules themselves.

The above description is only the preferred embodiments of the present application and the description of the principles of applied techniques. It will be appreciated by those skilled in the art that, the scope of the claimed solutions as disclosed in the present application are not limited to those consisted of particular combinations of features described above, but should cover other solutions formed by any combination of features from the foregoing or an equivalent thereof without departing from the inventive concepts, for example, a solution formed by replacing one or more features as discussed in the above with one or more features with similar functions disclosed (but not limited to) in the present application.

What is claimed is:

1. A method for axial-scanning a sample, comprising:
generating a scanning beam along a transverse scanning direction across the sample;
acquiring radial positions of the generated scanning beam along the transverse scanning direction; and
determining, based on the radial positions of the generated scanning beam and desired focal lengths, a phase mask so that the scanning beam at different radial positions along the scanning direction is focused to different axial positions of the sample along an optical axis transverse to the scanning direction.

2. The method of claim 1, wherein the determining comprises:
obtaining the radial positions of the scanning beam by moving the scanning beam transversely across the phase mask; and
determining, according to an incidence angle and a refraction angle of the scanning beam to the phase mask, a profile of the phase mask.

3. The method of claim 2, wherein the determining comprises:
dividing the phase mask into a plurality of regions;
calculating a slope for each of the regions according to an incidence angle and a refraction angle of the scanning beam to the each of the regions; and
determining, from the calculated slope of all the regions, the profile of the phase mask.

4. The method of claim 2, wherein the profile of the phase mask functions as a continuous piecewise linear function.

5. The method of claim 1, wherein the phase mask comprises at least one of a lens, a 2D phase mask or a spatial light modulator.

6. The method of claim 1, wherein the generating is performed by at least one of a polygonal mirror scanner, a galvanometric scanner, a resonant scanner, an acoustic-opto deflector, or a spatial light modulator.

7. The method of claim 1, further comprising:
guiding the scanning beam onto radial positions of the phase mask by a collimation lens.

8. The method of claim 1, wherein the phase mask and the sample are static.

9. A system for axial scanning a sample, comprising:
a scanning beam generator, generating a scanning beam along a transverse scanning direction through the sample;
a detector, acquiring radial positions of the generated scanning beam along the transverse scanning direction; and
a phase mask determined, based on the radial positions of the generated scanning beam and desired focal lengths, so that the scanning beam at different radial positions is focused to different axial positions of the sample along an optical axis transverse to the scanning direction.

10. The system of claim 9, wherein the phase mask is determined by:
obtaining the radial positions of the scanning beam by moving the scanning beam transversely across the phase mask; and
determining, according to an incidence angle and a refraction angle of the scanning beam to the phase mask, a profile of the phase mask.

11. The system of claim 10, wherein the profile of the phase mask is determined by:
dividing the phase mask into a plurality of regions; and
calculating a slope for each of the regions according to the incidence angle and the refraction angle of the scanning beam to the each of the regions, to determine, from the calculated slope of all the regions, the profile of the phase mask.

12. The system of claim 10, wherein the profile of the phase mask is a continuous piecewise linear function.

13. The system of claim 9, wherein the phase mask is static and comprises at least one of a lens, a 2D phase mask or a spatial light modulator.

14. The system of claim 9, wherein the scanning beam generator comprises at least one of a polygonal mirror scanner, a galvanometric scanner, a resonant scanner, an acoustic-opto deflector, or a spatial light modulator.

15. The system of claim 9, further comprising a collimation lens, positioned between the scanning beam generator and the phase mask, for guiding the scanning beam onto radial positions of the phase mask.

16. The system of claim 9, wherein the phase mask and the sample are static.

17. A light sheet microscopy for imaging a sample, comprising:
- a detection objective lens, collecting emission signals from the sample;
- a galvanometric scanner, rotatable to guide the emission signals from the detection objective lens;
- a phase mask, receiving the emission signals guided at different radial regions on the phase mask from the scanner and adjusting focal lengths of the received emission signals, wherein the phase mask is designed based on positions of the emission signals and desired focal lengths; and
- an imaging device, capturing images of the sample based on the adjusted focal lengths, and wherein the designed phase mask is controlled to adjust the focal lengths such that focal planes of the emission signals are coincident with the imaging device.

* * * * *